(12) United States Patent
Egawa et al.

(10) Patent No.: US 7,122,888 B2
(45) Date of Patent: Oct. 17, 2006

(54) SEMICONDUCTOR DEVICE, ELECTRICAL INSPECTION METHOD THEREOF, AND ELECTRONIC APPARATUS INCLUDING THE SEMICONDUCTOR DEVICE

(75) Inventors: Ichiro Egawa, Tenri (JP); Yukihisa Orisaka, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/091,851

(22) Filed: Mar. 29, 2005

(65) Prior Publication Data

US 2005/0218512 A1 Oct. 6, 2005

(30) Foreign Application Priority Data

Mar. 31, 2004 (JP) .............................. 2004-105765

(51) Int. Cl.
*H01L 29/00* (2006.01)
*H01L 23/52* (2006.01)
*H01L 23/34* (2006.01)

(52) U.S. Cl. ...................... 257/691; 257/516; 257/528; 257/532; 257/308; 257/312; 257/522; 257/724; 257/924; 257/E29.218; 257/E23.057

(58) Field of Classification Search ................ 257/300, 257/308, 312, 522, 532, 535, 735, 736, 724, 257/924, E29.218, E23.057, 516, 528, 691; 438/611, 171, 190

See application file for complete search history.

(56) References Cited

U.S. PATENT DOCUMENTS

| 4,654,694 A | * | 3/1987 | Val .............................. 257/665 |
| 5,028,983 A | * | 7/1991 | Bickford et al. ............. 257/668 |
| 5,212,402 A | * | 5/1993 | Higgins, III ................. 257/532 |
| 5,444,298 A | * | 8/1995 | Schutz ......................... 257/691 |
| 5,576,577 A | * | 11/1996 | Takenouchi et al. ......... 257/672 |
| 6,320,757 B1 | * | 11/2001 | Liu .............................. 361/760 |
| 6,400,576 B1 | * | 6/2002 | Davidson ..................... 361/763 |
| 6,518,649 B1 | | 2/2003 | Iwane et al. |

FOREIGN PATENT DOCUMENTS

JP 07-161923 A 6/1995

* cited by examiner

*Primary Examiner*—Jasmine Clark
(74) *Attorney, Agent, or Firm*—Harness, Dickey & Pierce, P.L.C.

(57) ABSTRACT

A semiconductor device is arranged so as to include (i) a wire L1, connected directly to an LSI chip, which serves as a VGL wire for supplying a voltage VGL to the LSI chip, and (ii) a wire LB1 connected not directly to but to one of a pair of electrodes of a capacitor provided between the wire LB1 and a voltage VGH wire, each of the wire L1 and the wire LB1 including a voltage input terminal. This arrangement provides (i) a semiconductor device, including a built-in capacitor, which makes it possible to shorten time required in an electrical screening test (final test) so as to reduce cost, and (ii) an electrical inspection method of the semiconductor device.

13 Claims, 10 Drawing Sheets

SEMICONDUCTOR DEVICE, ELECTRICAL INSPECTION METHOD THEREOF, AND ELECTRONIC APPARATUS INCLUDING THE SEMICONDUCTOR DEVICE

This Nonprovisional application claims priority under 35 U.S.C. § 119(a) on Patent Application No. 2004/105765 filed in Japan on Mar. 31, 2004, the entire contents of which are hereby incorporated by reference.

FIELD OF THE INVENTION

The present invention relates to a COF (chip on film)-type semiconductor device mounted in a display device such as a liquid crystal display device, an electrical inspection method thereof, and an electronic apparatus such as a display device including the semiconductor device.

BACKGROUND OF THE INVENTION

Conventionally, a semiconductor device called a COF (chip on film) type has been used which includes a tape-shaped flexible wire substrate (tape carrier) and a semiconductor chip, such as an IC (integrated circuit) and an LSI (large-scale integrated circuit), bonded to and mounted on a surface thereof. For example, Japanese Laid-Open Patent Publication No. 176918/2001 (Tokukai 2001-176918; published on Jun. 29, 2001; corresponding to U.S. Pat. No. 6,518,649) discloses as one example of the COF-type semiconductor device a semiconductor device as shown in FIG. 10. FIG. 10 is a cross-sectional view of the COF-type semiconductor device.

In FIG. 10, the reference numeral 101 represents a semiconductor element, and the reference numeral 126 represents a tape carrier. Provided on a surface of the semiconductor element 101 is a gold bump 103, and the tape carrier 126 includes a tape base material 107, such as polyimide, and a wire pattern 104 of copper formed thereon. Further, provided partially on the tape base material 107 and the wire pattern 104 is a solder resist 110. The wire pattern 104 includes an inner lead 114 bonded to the gold bump 103 on the semiconductor element 101, an external connection terminal (outer lead) 113, a component pattern, and the like. The inner lead 114, which is an exposed part not coated with the solder resist 110, is provided with a tin plate 108, and the chip part-mounting pattern and the external connection terminal 113 are provided with a gold plate 106.

FIG. 11 is an enlarged cross-sectional view of a bonding part of the semiconductor element 101 and the tape carrier 126. As shown in FIG. 11, the gold bump 113 is formed on an electrode 102 of the semiconductor element 101. The tin plate 108 of the inner lead 114 and the gold bump 103 are bonded to each other with a eutectic alloy formed therebetween. Under such a condition that the gold bump 103 and the inner lead 114 are thus bonded to each other, the tape base material 107 covers an entire surface of the semiconductor element 101. Moreover, the bonding part of the semiconductor element 101 and the tape carrier 126 is sealed with a resin 111.

In manufacture of such a COF-type semiconductor device 125, the tape carrier 126 is longitudinal, and the semiconductor element 101 is mounted at regular intervals on the tape carrier 126 in the same direction with respect to a tape direction. In this mounting method, as shown in FIG. 11, the tin plate 108 provided on the wire pattern 104 of the tape base material 107 and the gold bump 103 provided on the electrode 102 of the semiconductor element 101 are heated from the back of the semiconductor element 101 (the surface reverse to the surface provided with the bump 103) and pressurized from the back of the wire pattern 104 of the tape base material 107. In this way, the eutectic alloy 109 of gold and tin is formed as described above, and the semiconductor element 101 is bonded to the tape carrier 126.

Mounting of the external connection terminal 113 is performed mainly by thermal pressure bonding with an ACF (anisotoropic conductive film) or by solder bonding.

Further, demands of users for a gold-plated connector are satisfied by two-color plating, i.e., by gold-plating only the external connection terminal 113 later. In a producing method of a two-color-plated tape carrier, a copper-plated tape carrier is etched to form a wire pattern, and after a solder resist is applied to the wire pattern, the wire pattern is subjected to a tin-plating treatment. That portion of the wire pattern 104 which is bonded to the semiconductor element 101 (inner lead 114) is coated with a wire-pattern protection mask, and the tin plate 108 on an exposed portion is removed. After removal of the tin plate 108, the portion is subjected to a gold-plating treatment. After the treatment, the wire-pattern protection mask is removed for inspection and shipment.

Meanwhile, conventionally, an element such as a chip capacitor has been mounted on a semiconductor package. The chip capacitor is mounted to remove a harmonic noise included in power supplied from the outside and prevent malfunction of a semiconductor element such as an LSI. A capacitor having such a function is called a bypass capacitor.

As one example of a semiconductor device provided with such a chip capacitor, Japanese Laid-Open Patent Publication No. 161923/1995 (Tokukaihei 7-161923; published on Jun. 23, 1995) discloses a semiconductor device as shown in FIG. 12. In this arrangement, there is a semiconductor package 201 with a chip 202 and a chip capacitor 204 mounted thereon. Provided on a central portion of the semiconductor package 201 is a cavity 208 for mounting the chip 102. Provided around the cavity 208 is a bonding stitch 207. Provided around the semiconductor package 201 is a drawing pad 210.

Such a semiconductor device is assembled as follows. First, the chip 102 is mounted in the cavity 208 with an Au—Si or silver paste, and an aluminum line is bonded to each terminal. Then, sealing is performed with a cap or the like for completion of the assembly. Thereafter, the chip capacitor 204 is bonded to the drawing pad 210 on the semiconductor package 201 with soldering or the like.

On one hand, as a market expands, there are a diversity of market demands for thin display devices such as liquid crystal display devices. On the other hand, in an ever-progressing field of thin display devices, development manufacturers are required to accelerate product development so as to lead the demands immediately to product commercialization, i.e., so as to shorten lead time. Similarly, in a filed of an integrated circuit device constituting a driving circuit section for driving a peripheral part and, in particular, a display panel, the development manufacturers are strongly required to shorten lead time.

In a field of liquid crystal display devices and, in particular, liquid crystal television sets among thin display devices, manufacturers are entering an era of fierce competition as an environment is created in which 40-or-more-inch liquid crystal television sets can be mass-produced. Particularly, a large-sized liquid crystal panel has a larger load capacitance, needs to be operated with a higher voltage and a higher frequency, and therefore is susceptible to noise and the like. Accordingly, as measures against such a problem, Japanese Laid-Open Patent Publication No. 161923/1995 describes an arrangement in which bypass capacitors and the like are mounted in a semiconductor device.

FIG. 13 shows one example of a wire in a conventional gate driver serving as a COF-type semiconductor device provided with the bypass capacitors for preventing malfunction of the semiconductor element. Note that, in FIG. 3, only power supply wires are shown and signal lines are not shown.

Right and left sides of an LSI chip 301 are supplied with a voltage (power supply voltage) VCC, a voltage (ground voltage) GND, a voltage (power supply voltage) VGH, and a voltage (power supply voltage) VGL. Here, a bypass capacitor is disposed between a supply line of the voltage GND and a supply line of the voltage VGL, between the supply line of the voltage GND and a supply line of the voltage VGH, between the supply line of the voltage GND and a supply line of the voltage VCC, and between a supply line of the VGH and a supply line of the VGL.

Specifically, a bypass capacitor c1 is provided between a wire 302 for supplying the voltage VGL and a wire 303 for supplying the voltage VGH. A bypass capacitor c2 is provided between the wire 303 for supplying the voltage VGH and a wire 304 for supplying the voltage GND. A bypass capacitor c3 is provided between the wire 304 for supplying the voltage GND and a wire 305 for supplying the voltage VCC.

Further, bypass capacitors c4 and c5 are provided between the other wire 306 for supplying the voltage VGL and the other wire 308 for supplying the voltage GND. Here, the bypass capacitor c5, inserted in parallel to the bypass capacitor c4, is used to increase a capacitance.

However, a conventional semiconductor device provided with a built-in bypass capacitor, requiring longer time for testing in a test step, more specifically, in a final test step, has such a problem that productivity decreases and cost increases.

That is, as shown in FIG. 13, although no bypass capacitor is connected to a wire 309 for supplying the voltage VCC and a wire 307 for supplying the voltage VGH, each of (i) the wires 302 and 306 for supplying the voltage VGL and (ii) the wires 304 and 308 for supplying the voltage GND is connected to a capacitor (the capacitor c1, c2, c3, or c4). Therefore, for such reasons as the capacitance of the bypass capacitors c1 to c4 connected to the wires 302, 306, 304, and 308, it takes a long time to supply the voltage VGL and the voltage GND to the LSI chip 301 for the purpose of testing. As a result, a test requires a long time.

SUMMARY OF THE INVENTION

The present invention, completed in consideration of the foregoing problems, has as an object to provide (i) a semiconductor device, provided with a built-in capacitor, which can be manufactured at reduced cost due to shorter time required in an electrical screening test (final test), (ii) an electrical inspection method of the semiconductor device, and (iii) an electronic apparatus including the semiconductor device.

In order to solve the foregoing problems, a semiconductor device according to the present invention includes a first power supply voltage wire for supplying a first power supply voltage to a semiconductor chip; a second power supply voltage wire for supplying a second power supply voltage to the semiconductor chip; and a capacitor provided between the first power supply voltage wire and the second power supply voltage wire, the first power supply voltage wire and the second power supply voltage wire being provided on a tape carrier on which the semiconductor chip is mounted, the first power supply voltage wire including: (i) a bypass wire connected not directly to the semiconductor chip but to one of a pair of electrodes of the capacitor; and (ii) a direct wire connected directly to the semiconductor chip, each of the bypass wire and the direct wire including a voltage input terminal.

In order to solve the foregoing problems, a method of the present invention for electrically inspecting the semiconductor device of the present invention includes the step of supplying the first power supply voltage to the semiconductor chip from the direct wire of the first power supply voltage wire and supplying the second power supply voltage to the semiconductor chip from the second power supply voltage wire, the step being carried out under such a condition that the bypass wire of the first power supply voltage wire is open.

According to the present invention, the first power supply voltage wire in the semiconductor device includes (i) a bypass wire, connected to one of a pair of electrodes of the capacitor, which is not connected to the semiconductor chip, and (ii) a direct wire connected directly to the semiconductor chip. Moreover, each of the bypass wire and the direct wire includes a voltage input terminal, so that the first power supply voltage can be applied to either or both of the bypass wire and the direct wire.

Therefore, when the first power supply voltage and the second power supply voltage are supplied to the semiconductor chip so as to conduct an electrical screening test, the first power supply voltage is supplied to the semiconductor chip from the direct wire of the first power supply voltage wire, and the second power supply voltage is supplied to the semiconductor chip from the second power supply voltage wire, under such a condition that the bypass wire of the first power supply voltage wire is open. This makes it possible to quickly supply the first power supply voltage and the second power supply voltage to the semiconductor chip (speedily supply power) so as to conduct a test without being affected by capacitance and the like of the capacitor.

As a result, in a semiconductor device with built-in capacitors, it becomes possible to shorten time required in an electrical screening test (final test) so as to reduce cost.

In order to solve the foregoing problems, an electronic apparatus according to the present invention includes the semiconductor device according to the present invention and is arranged so that the first power supply voltage is applied to the bypass wire and the direct wire of the first power supply voltage wire.

When an electronic apparatus including the semiconductor device is operated normally, the first power supply voltage is applied to the bypass wire and the direct wire in the first power supply voltage wire, so that the capacitor connected to the bypass wire functions as a bypass capacitor provided between the first power supply voltage wire and the second power supply voltage wire without any problem, thereby preventing malfunction of the semiconductor chip.

Further, in order to solve the foregoing problems, another semiconductor device according to the present invention includes a first power supply voltage wire for supplying a first power supply voltage to a semiconductor chip; a second power supply voltage wire for supplying a second power supply voltage to the semiconductor chip; a third power supply voltage wire for supplying a third power supply voltage; a capacitor provided between the first power supply voltage wire and the second power supply voltage wire; and another capacitor provided between the second power supply voltage wire and the third power supply voltage wire, the first power supply voltage wire, the second power supply voltage wire, and the third power supply voltage wire being provided on a tape carrier on which a semiconductor chip is mounted, the first power supply voltage wire including: (i) a bypass wire connected not directly to the semiconductor chip but to one of a pair of electrodes of the capacitor disposed between the bypass wire and the second power supply voltage wire; and (ii) a direct wire connected directly to the semiconductor chip, each of the bypass wire and the direct wire including a voltage input terminal, and the second power supply voltage wire including: (iii) a bypass wire connected not directly to the semiconductor chip but to one of a pair of electrodes of the another capacitor disposed between the bypass wire and the third power supply voltage wire; and (iv) a direct wire connected directly to the semiconductor chip and to one of a pair of electrodes of the capacitor disposed between the direct wire and the first power supply voltage wire, each of the bypass wire and the direct wire including a voltage input terminal.

In order to solve the foregoing problems, another method of the present invention for electrically inspecting the another semiconductor device of the present invention includes the step of supplying the first power supply voltage to the semiconductor chip from the direct wire of the first power supply voltage wire, supplying the second power supply voltage to the semiconductor chip from the second power supply voltage wire, and supplying the third power supply voltage to the semiconductor chip from the third power supply voltage wire, the step being carried out under such a condition that the bypass wire of the first power supply voltage wire and the bypass wire of the second power supply voltage wire are open.

According to the present invention, the first power supply voltage wire includes (i) a bypass wire, connected to one of a pair of electrodes of the capacitor disposed between the bypass wire and the second power supply voltage wire, which is not connected to the semiconductor chip, and (ii) a direct wire connected directly to the semiconductor chip. Moreover, each of the bypass wire and the direct wire includes a voltage input terminal, so that the first power supply voltage can be applied to either or both of the bypass wire and the direct wire.

Further, the second power supply voltage wire includes (i) a bypass wire, connected to one of a pair of electrodes of the capacitor disposed between the bypass wire and the third power supply voltage wire, which is not connected to the semiconductor chip, and (ii) a direct wire connected directly to the semiconductor chip and to one of a pair of electrodes the capacitor disposed between the direct wire and the first power supply voltage wire. Moreover, each of the bypass wire and the direct wire is provided with a voltage input terminal, so that the second power supply voltage can be applied to either or both of the bypass wires and the direct wires.

Therefore, when the first, second, and third power supply voltages are supplied to the semiconductor chip so as to conduct an electrical screening test, the first power supply voltage is supplied to the semiconductor chip from the direct wire of the first power supply voltage wire, and the second power supply voltage is supplied to the semiconductor chip from the direct wire of the second power supply voltage wire, and the third power supply voltage is supplied to the semiconductor chip from the third power supply voltage wire, under such a condition that the bypass wire of the first power supply voltage wire and the bypass wire of the second power supply voltage wire are open. This makes it possible to quickly supply the first, second, and third power supply voltages to the semiconductor chip (speedily supply power) so as to conduct a test without being affected by such factors as the capacitance of the capacitors respectively disposed between the first power supply voltage wire and the second power supply voltage wire and between the second power supply voltage wire and the third power supply voltage wire.

As a result, in a semiconductor device with built-in capacitors, it becomes possible to shorten time required in an electrical screening test so as to reduce cost.

In order to solve the foregoing problems, another electronic apparatus of the present invention includes the another semiconductor device of the present invention and is arranged so that the first power supply voltage is applied to the bypass wire and the direct wire of the first power supply voltage wire, and the second power supply voltage is applied to the bypass wire and the direct wire of the second power supply voltage wire.

When an electronic apparatus including the semiconductor device is operated normally, the first power supply voltage is applied to the bypass wire and the direct wire of the first power supply voltage wire, and the second power supply voltage is applied to the bypass wire and the direct wire of the second power supply voltage wire, so that the capacitor connected to the bypass wire of the first power supply voltage wire functions as a bypass capacitor provided between the first power supply voltage wire and the second power supply voltage wire without any problem, and the capacitor connected to the bypass wire of the second power supply voltage wire functions as a bypass capacitor provided between the second power supply voltage wire and the third power supply voltage wire without any problem, thereby preventing malfunction of the semiconductor chip.

For a fuller understanding of the nature and advantages of the invention, reference should be made to the ensuing detailed description taken in conjunction with the accompanying drawings.

DESCRIPTION OF THE EMBODIMENTS

One embodiment of the present invention will be described below with reference to FIGS. 1 to 9.

First, a display device will be described in which a semiconductor device of one embodiment according to the present invention is mounted as a display driver.

Figure 5:
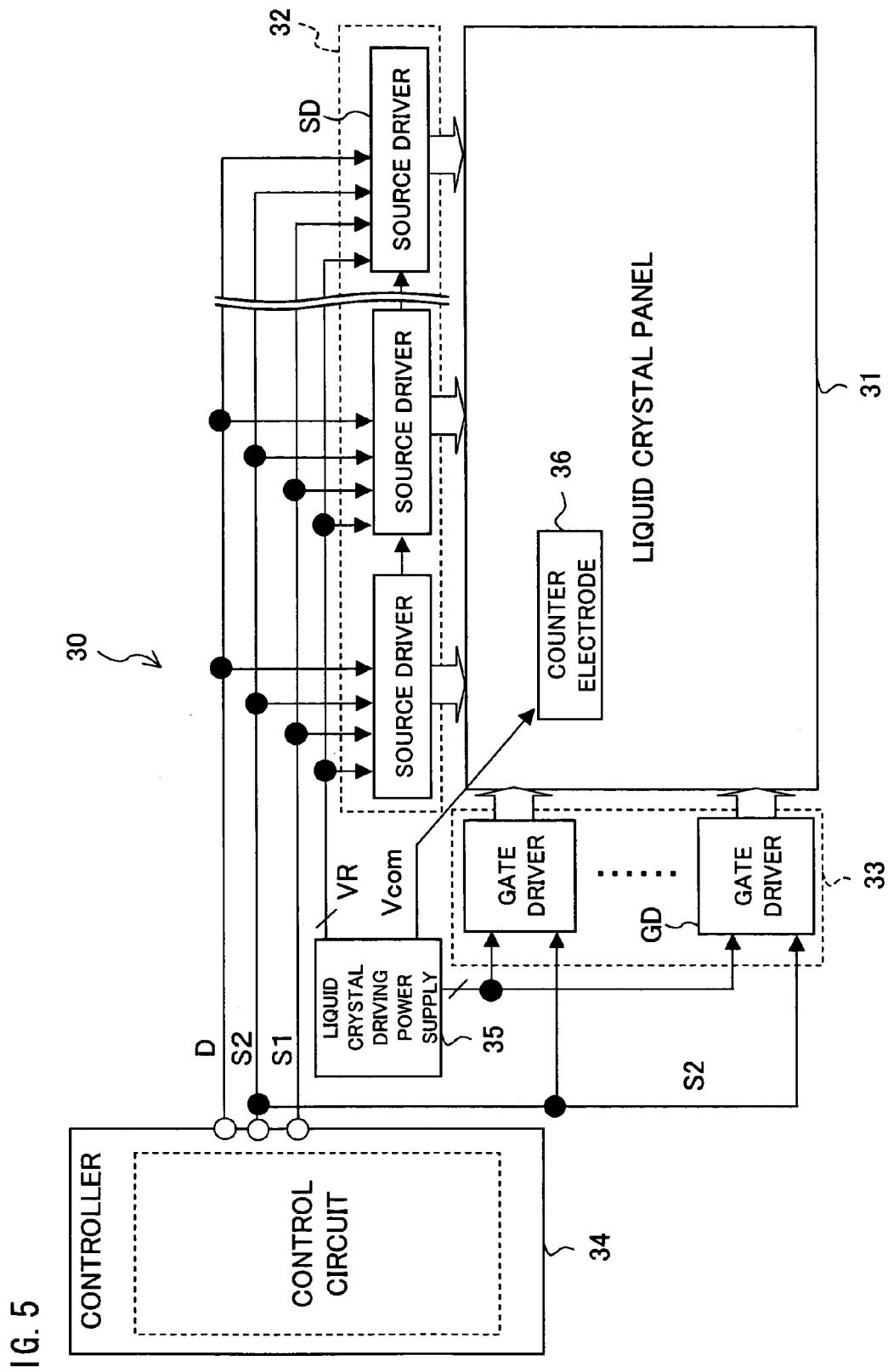
FIG. 5 is a block diagram showing an arrangement of an active-matrix liquid crystal display device including the liquid crystal panel, the gate driver, and the source driver.

FIG. 5 is a block diagram showing an arrangement of a TFT (thin film transistor) liquid crystal display device, being an example of a display device, which is a typical example of an active matrix display device. A liquid crystal display device (electronic apparatus) 30 includes a liquid crystal display section and a liquid crystal driving device for driving the liquid crystal display section. Moreover, the liquid crystal display section has a TFT liquid crystal panel 31 (hereinafter referred to as a liquid crystal panel 31).

Figure 6:
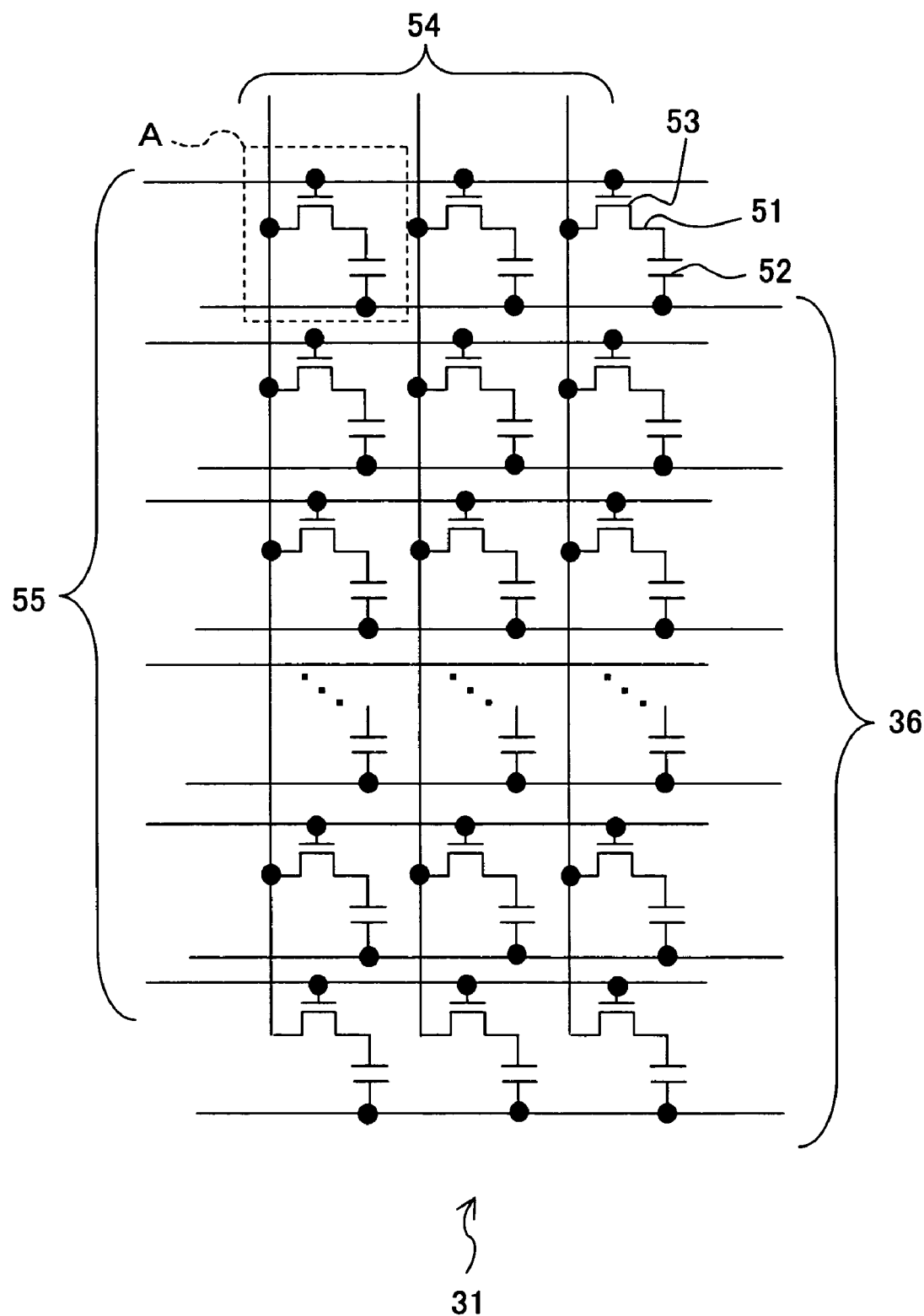
FIG. 6 is an equivalent circuit diagram showing an electrical arrangement of the liquid crystal panel.

The liquid crystal panel 31, as shown in FIG. 6, has a pixel electrode 51, a pixel capacitor 52, TFTs 53 each serving as an element for turning on and off a voltage applied to a pixel, a source signal line 54, a gate signal line 55, and a counter electrode (common electrode) 36. In FIG. 6, an area indicated by A is a liquid crystal display element for a single pixel.

The source signal line 54 receives from a source driver section 32 to be described later (see FIG. 5) a gradation display voltage in accordance with the brightness of a pixel to be displayed. The gate signal line 55 receives from a gate driver section 33 to be described later (see FIG. 5) a scanning signal so as to sequentially supply power to the TFTs 53 arranged in a longitudinal direction. When a voltage of the source signal line 54 is applied through each of the TFTs 53 in an on-state to the pixel electrode 51 connected to a drain of the TFT 53, a charge is stored in the pixel capacitor 52 between the pixel electrode 51 and the counter electrode 36, and a liquid crystal changes in optical transmittance for display.

Meanwhile, as shown in FIG. 5, the liquid crystal driving device has the source driver section 32, the gate driver section 33, a controller 34, and a liquid crystal driving power supply 35. The controller 34 outputs digitalized display data (e.g., RGB signals respectively corresponding to red, green, and blue; hereinafter referred to as display data D) and various control signals to the source driver section 32, and outputs the various control signals to the gate driver section 33.

A main control signal outputted to the source driver section 32 is for example a horizontal synchronizing signal, a start pulse signal, and a source-driver clock signal, and is indicated by S1 in FIG. 5. Meanwhile, a main control signal outputted to the gate driver section 33 is for example a vertical synchronizing signal and a gate-driver clock signal, and is indicated by S2 in FIG. 5.

The liquid crystal driving power supply 35 supplies a liquid crystal panel display voltage to the source driver section 32 and the gate driver section 33 and, for example, supplies to the source driver section 32 a reference voltage VR for generating a gradation display voltage in the source driver section 32. Externally inputted display data is inputted through the controller 34 into the source driver section 32 as the display data D in a digital manner.

The source driver section 32 has a source driver (semiconductor device) SD and, here, has a plurality of source drivers SD . . . each of which is the source driver SD. Further, the gate driver section 33 has a gate driver (semiconductor device) GD and, here, has a plurality of gate drivers GD . . . each of which is the gate driver GD.

Figure 2A:
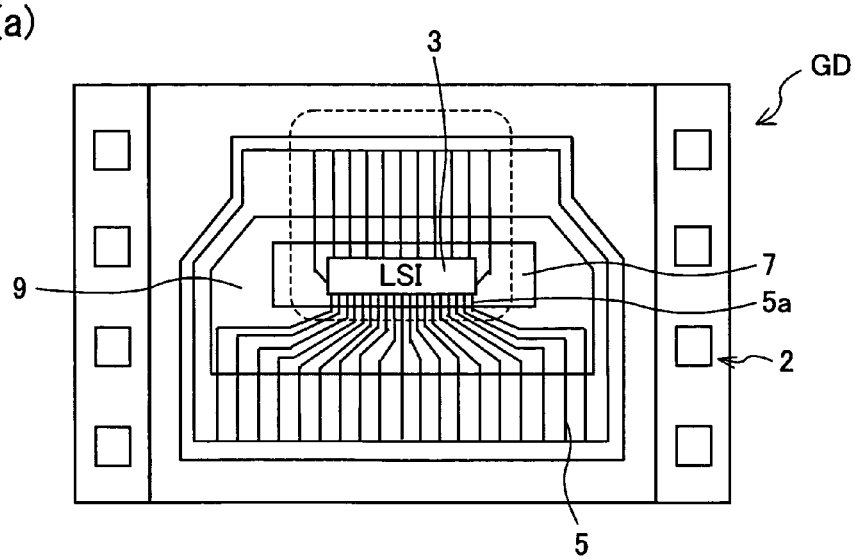
FIG. 2(a) is a plan view of the gate driver constituted of a COF-type semiconductor device.
Figure 2B:
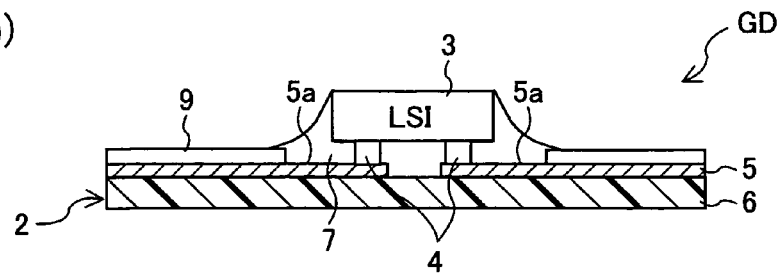
FIG. 2(b) is a cross-sectional view of the same.

The source driver SD and the gate driver GD, described in detail later, are arranged so that, as shown in FIGS. 2(a) and 2(b), an LSI chip (semiconductor chip) 3 is mounted on a tape carrier 2. The source driver SD and the gate driver GD are arranged so that a terminal formed on the tape carrier 2 is electrically connected through an ACF (not shown) to an electrode on the liquid crystal panel 31, thereby electrically connecting the LSI chip 3 mounted on the tape carrier 2 to the liquid crystal panel 31. Note that, in FIG. 5, a power supply for driving the LSI chip 3 of the source driver SD and the gate driver GD is omitted.

The source driver SD latches the display data D so inputted in a time-sharing manner in an inside thereof and then performs a DA (digital-analog) conversion in synchronism with a horizontal synchronizing signal (also referred to as a latch signal LS (see FIG. 7)) inputted from the controller 34. Moreover, the source driver SD outputs a gradation display analog voltage (gradation display voltage), obtained from the DA conversion, from a liquid crystal driving voltage output terminal through the source signal line 54 (see FIG. 6) to a liquid crystal display element (not shown), corresponding to the liquid crystal driving voltage output terminal, in the liquid crystal panel 31.

Figure 7:
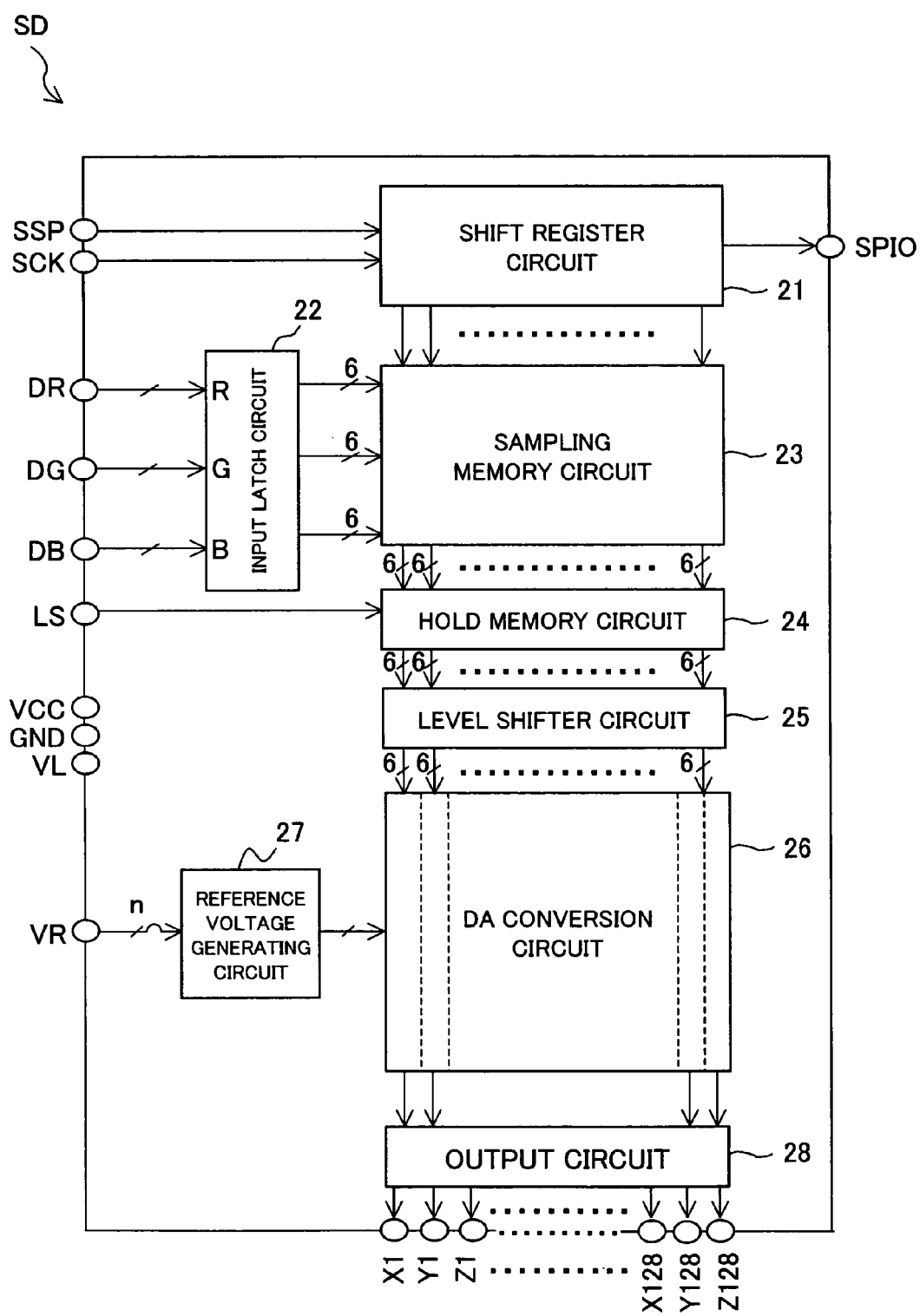
FIG. 7 is a block diagram showing an arrangement of the source driver.

The source driver SD, as shown in FIG. 7, has a shift register circuit 21, an input latch circuit 22, a sampling memory circuit 23, a hold memory circuit 24, a level shifter circuit 25, a DA conversion circuit 26, a reference voltage generating circuit 27, and an output circuit 28. Further, the source driver SD has terminals for respectively receiving a clock signal SCK, a start pulse signal SSP, a voltage (power supply voltage) VCC, a voltage (ground voltage) GND, a latch signal VLS, display data DR, DG, and DB, a voltage (reference voltage) VR, and a voltage (power supply voltage) VLS. Furthermore, the source driver has a large number of output terminals X1 to X128, Y1 to Y128, and Z1 to Z128.

The shift register circuit 21 shifts the inputted start pulse SSP in synchronism with the inputted clock signal SCK. A control signal is outputted from each stage of the shift resister circuit 21 to the sampling memory circuit 23. Note that the start pulse SSP is a signal synchronized with the horizontal synchronizing signal LS of the display data D. Further, the start pulse SSP shifted in the shift register circuit 21 is inputted as a start pulse SSP into a shift register circuit 21 in an adjacent source driver SD, is shifted in the same manner, and is transferred to a shift register 21 in a source driver SD positioned farthest from the controller 34.

The latch input circuit 22 temporarily latches the display data DR, DG, and DB, respectively inputted serially into input terminals corresponding to the respective colors, each of which has 6 bits, and sends the display data DR, DG, and DB to the sampling memory circuit 23.

The sampling memory circuit 23 samples the display data DR, DG, DB (each having 6 bits to make 18 bits in total) sent from the input latch circuit 22 in a time-sharing manner by using an output signal (control signal) from each stage of the shift register circuit 21, and memorizes the display data DR, DG, and DB until the display data DR, DG, and DB for a single horizontal synchronizing period are gathered.

The hold memory circuit 24 latches the inputted display data DR, DG, and DB based on the horizontal synchronizing signal (hold signal) LS, and retains the display data DR, DG, and DB until a next horizontal synchronizing signal LS is inputted, and outputs the display data DR, DG, and DB to the level shifter circuit 25.

The level shifter circuit 25 converts, e.g., boosts signal levels of the display data DR, DG, and DB in conformity to a DA conversion circuit 26, which is provided in a next stage and which processes a level of a voltage applied to the liquid crystal panel 31. The level shifter circuit 25 outputs display data D'R, D'G, and D'B.

The reference voltage generating circuit 27, based on the reference voltage VR from the liquid crystal driving power supply 35, generates 64-level analog voltages used for gradation display and outputs the 64-level analog voltages to the DA conversion circuit 23.

The DA conversion circuit 26 selects one of the 64-level analog voltages for each of the display data D'R, D'G, and D'B (each display data is 6-bit digital data inputted from the level shifter circuit 25), and thereby converts the digital data into an analog voltage. Then, the DA conversion circuit 26 outputs the analog data to the output circuit 28. More specifically, the DA conversion circuit 26 has 6 switches corresponding to 6 bits. Through switching of the 6 switches in accordance with the 6-bit display data D'R, D'G, and D'B, the DA conversion circuit 26 selects one of the 64-level analog voltages inputted from the reference voltage generating circuit 27.

The output circuit 28 converts into a low impedance signal the analog signal selected by the DA conversion circuit 26 and outputs the low impedance signal to the liquid crystal panel 31 through the output terminals X1 to X128, Y1 to Y128, and Z1 to Z128.

The output terminals X1 to X128, Y1 to Y128, and Z1 to Z128 correspond to the display data DR, DG, and DB respectively. Thus, each source driver for 64-gradation display outputs to the liquid crystal panel 31 an analog signal corresponding to a gradation level based on the display data DR, DG, and GB so as to perform 64-gradation display.

Meanwhile, operation of the gate driver GD is controlled based on various signals, such as a vertical synchronizing signal (e.g., a start pulse signal GSP) and a gate-driver clock signal (GCK), supplied from the controller 34. Plural kinds of voltages (described later) are applied to the gate driver GD by the liquid crystal driving power supply 35. The gate driver GD supplies a signal to a plurality of gate signal lines 55 . . . .

Figure 8:
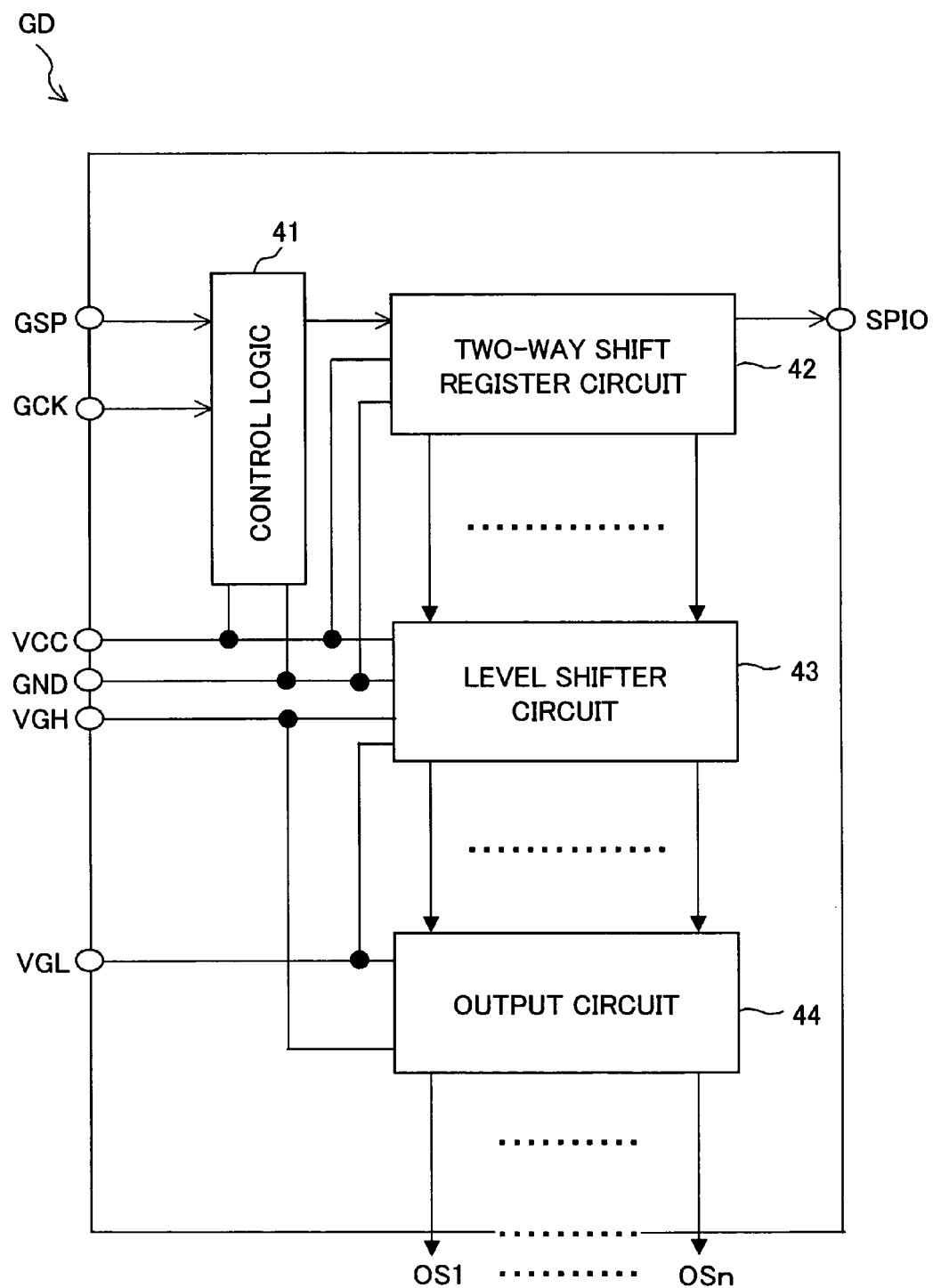
FIG. 8 is a block diagram showing an arrangement of the gate driver.

The gate driver GD, as shown in FIG. 8, includes a control logic 41, a two-way shift register circuit 42, a level shifter circuit 43, an output circuit 44, and the like. The gate driver GD has terminals for respectively receiving clock signals GCK, start pulse signals GSP, a voltage (power supply voltage) VCC, a voltage (ground voltage) GND, a voltage (power supply voltage) VGH, and a voltage (power supply voltage) VGL. Furthermore, the gate driver GD has a large number of output terminals OS1 to OSn.

The control logic 41 generates a signal necessary for operation of the two-way shift register circuit 42 and supplies the signal to the two-way shift register circuit 42. When the two-way shift register circuit 42 is supplied with the clock signal GCK and the start pulse signal GSP, the two-way shift register circuit 42 performs shift operation to sequentially synchronize the start pulse signal GSP with the clock signal GCK. The two-way shift register circuit 42 generates a selection pulse for selecting a pixel electrode, of the liquid crystal panel 31, to be driven by a voltage applied to the source signal line 54 by the source driver SD, and outputs the selection pulse to the level shifter circuit 43. The level shifter circuit 43 converts a voltage of the selection pulse into a voltage necessary to turn on and off (to select and not to select) the TFT elements provided in the liquid crystal panel 31 and outputs the voltage to the output circuit 44.

The output circuit 44, based on a signal inputted from the level shifter circuit 43, applies to the gate signal lines 55 . . . through the output terminals OS1 to OSn the voltage necessary to turn on and off the TFT elements.

Figure 9:
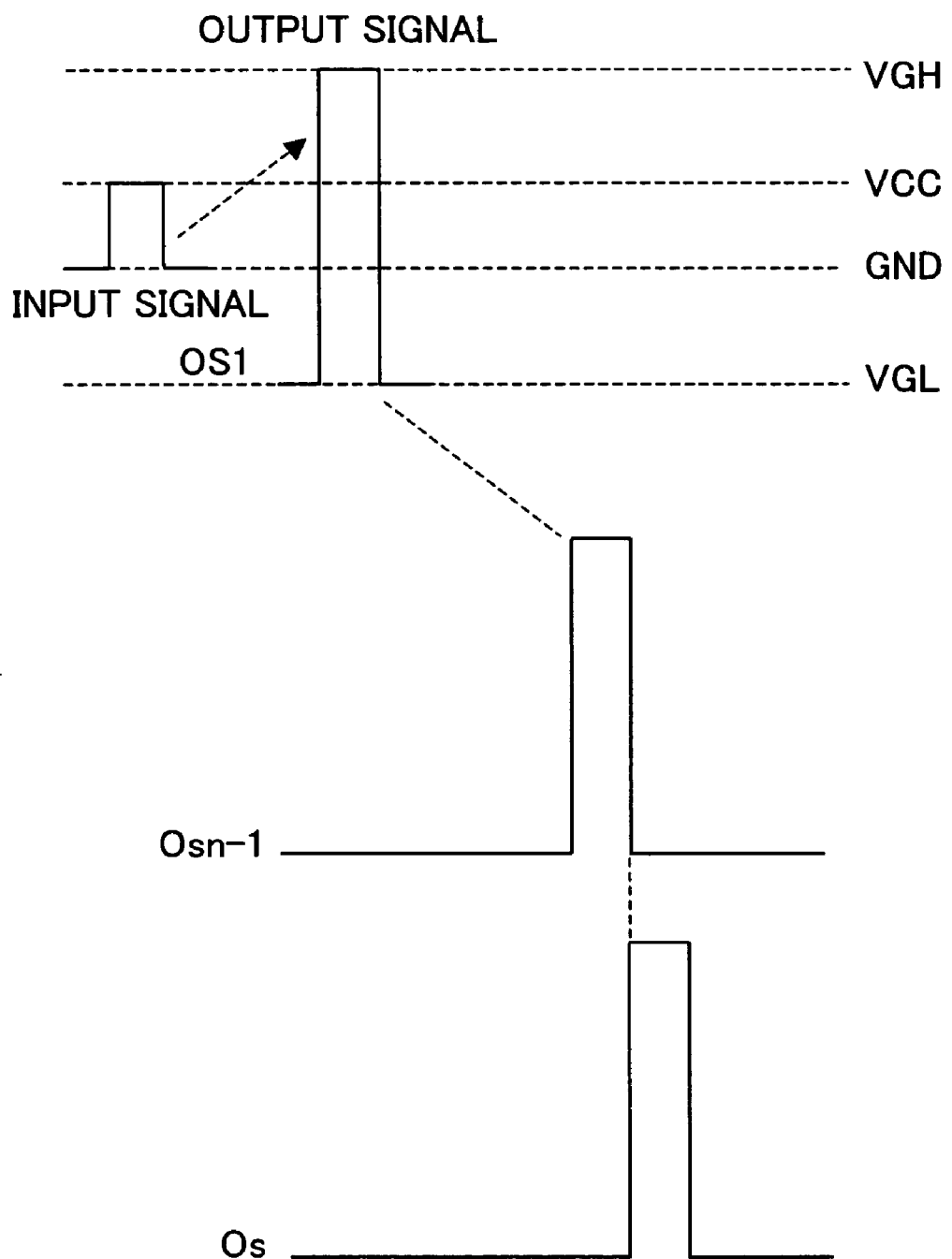
FIG. 9 illustrates a waveform of an output signal outputted from the gate driver.
Figure 10:
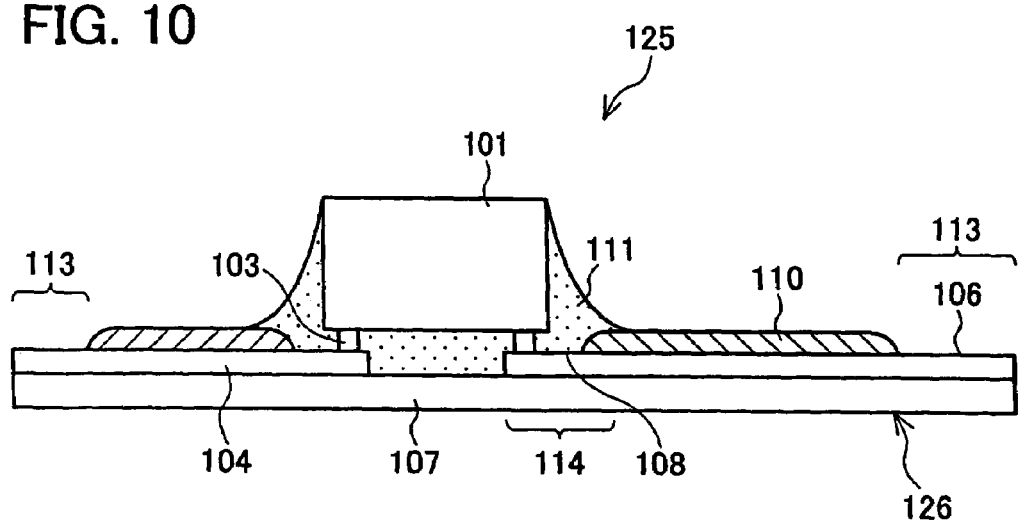
FIG. 10 is a cross-sectional view, showing a prior art, which shows an arrangement of a COF-type semiconductor device.
Figure 11:
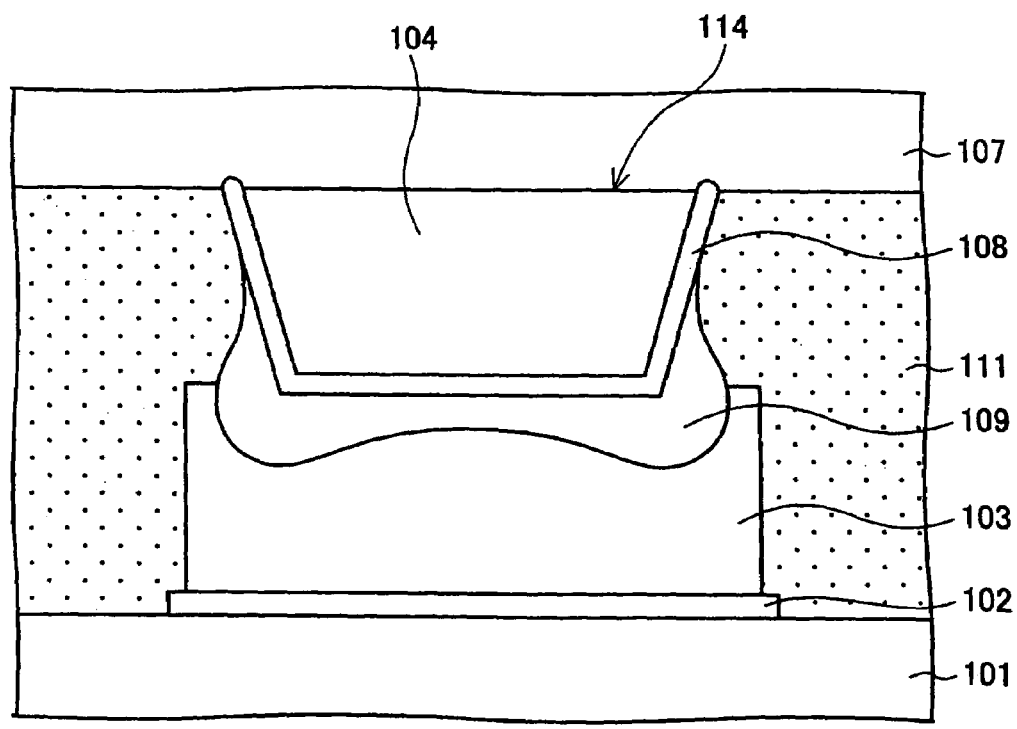
FIG. 11 is a cross-sectional view showing a bonding part of a semiconductor element and a tape carrier in the semiconductor device of FIG. 10.
Figure 12:
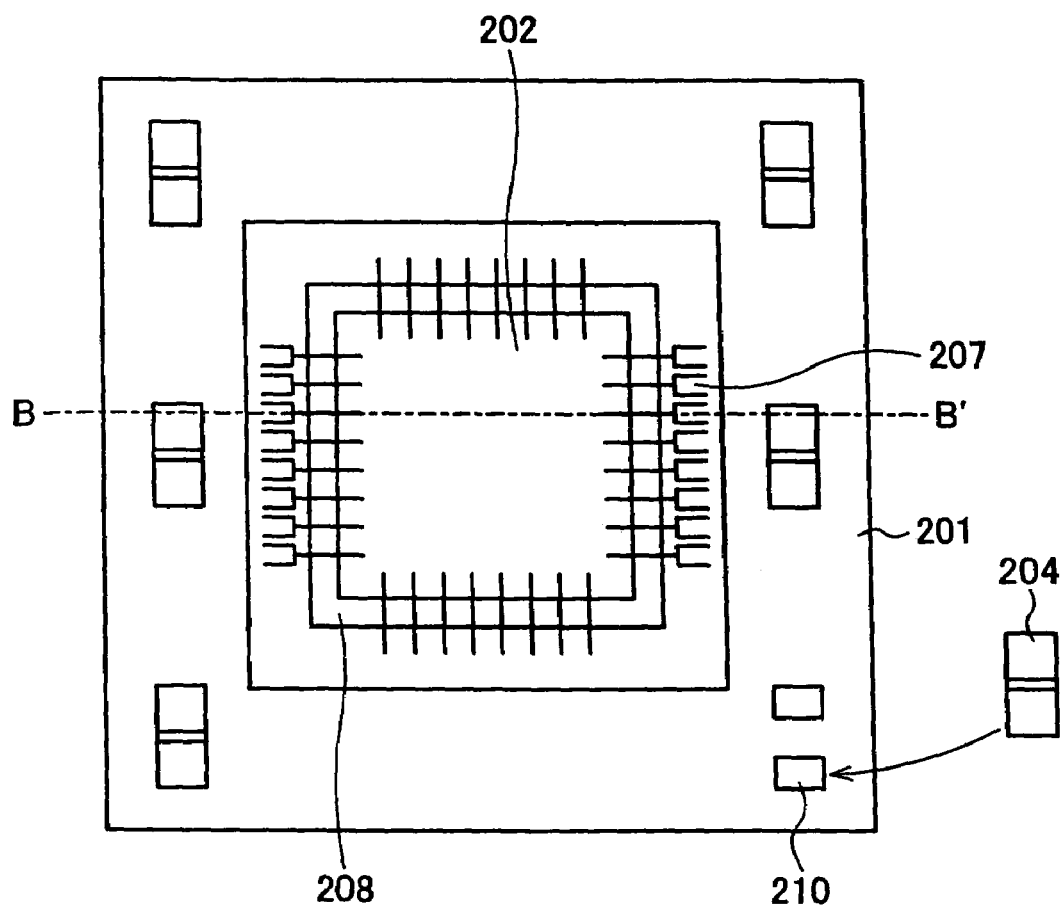
FIG. 12 is a plan view, showing a prior art, of a semiconductor device including a tape carrier and a chip capacitor mounted thereon.

When the output circuit 44, as shown for example in FIG. 9, is supplied with an input signal of the voltage VCC, the output circuit 44 supplies an output signal of the voltage VGH sequentially to the output terminals OS1 to OSn. When the output circuit 44 is not supplied with an input signal (i.e., in case of the voltage GND), the output circuit 44 supplies an output signal of the voltage VGL to the output terminals OS1 to OSn.

In the following, a step of producing the gate driver GD will be briefly described. First, wafers (liquid crystal driver chip wafers) for producing an LSI chip in the gate driver GD are produced. In this case, a gold bump is formed by plating on an electrode pad on the LSI chip constituting the gate driver GD. A height and a size of the gold bump vary according to a bump pitch. However, there is formed a bump for example with a height of 10 to 20 um and a size of 40 to 100 um.

Upon completion of production of the wafers, a wafer test is conducted to judge the wafers to be good or defective. Then, only each of the wafers judged to be good is bonded on a dicing sheet and diced with a dicing device for a chip unit serving as the gate driver GD.

After the dicing step, as shown in FIGS. 2(a) and 2(b), the LSI chip 3 which is individually separated is mounted on the tape carrier (COF-type tape carrier) 2 formed by providing a wire pattern 5 on an insulative film 6.

Selected as the tape carrier 2 is a tape carrier having a width and the wire pattern 5 in accordance with a size of the LSI chip 3 to be mounted and a number of outputs of the LSI chip 3 to be mounted. Further, the wire pattern 5 on the tape carrier 2 is provided with a pattern (not shown) functioning as a bypass capacitor. FIG. 2 illustrates only a part of the tape carrier 2 for one gate driver GD. In reality, however, the tape carrier is a long sheet (tape), and a plurality of LSI chips 3 are mounted thereon along the longitudinal direction.

The LSI chip 3 is connected to the tape carrier 2 by bonding the gold bump 4 of the LSI chip 3 to the inner lead 5a of the tape carrier 2 with an inner lead bonding device or the like. After completion of inner lead bonding, a resin potting step is carried out so as to coat the LSI chip 3 with a resin 7. Note that a solder resist is indicated by a reference numeral 9 in FIGS. 2(a) and 2(b).

Thereafter, a final test is conducted in the electrical screening step so as to sort out good gate drivers GD (semiconductor devices). After the final test, the tape carrier 2, which is a long sheet (tape) on which the gate drivers GD are mounted, is reeled. The gate drivers GD are packed and shipped in this state. Note that the source driver SD is produced by the same steps as the gate driver GD.

Figure 1:
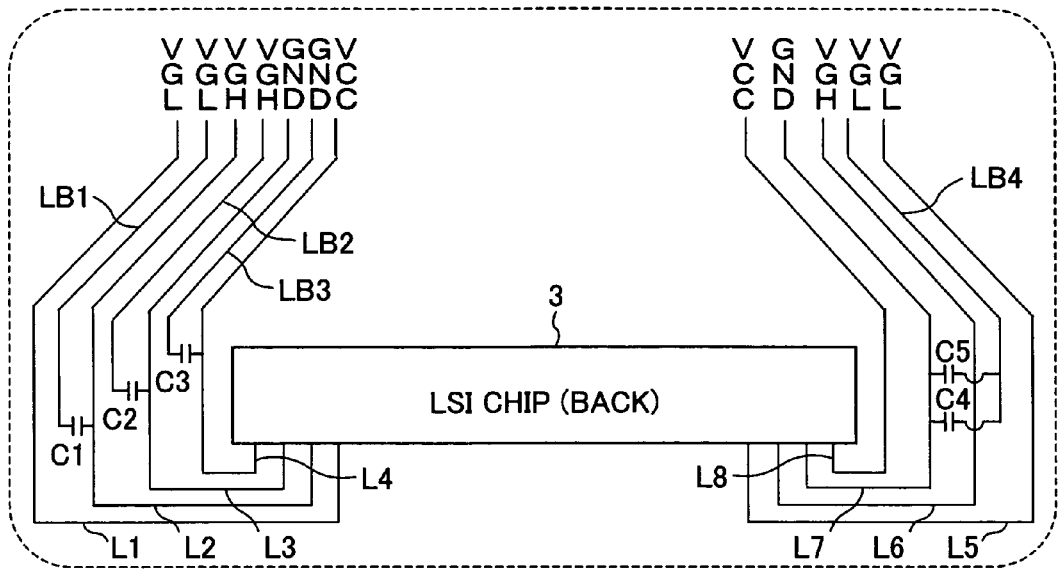
FIG. 1 is a wiring diagram, showing one embodiment of the present invention, which shows one example of a power supply voltage wire in a gate driver mounted in a liquid crystal panel.

With reference to FIG. 1, the following describes an example of a wire pattern of the gate driver GD. In this wire pattern, such patterns that function as bypass capacitors are formed on the tape carrier. Note that FIG. 1 shows only those wires associated with power supply, while omitting signal lines.

As shown in FIG. 1, as with the LSI chip 301 (see FIG. 13) in a conventional gate driver provided with a bypass capacitor, right and left sides of the LSI chip 3 are each supplied with four kinds of power supply voltages: a voltage VCC, a voltage GND serving as a ground voltage, a voltage VGH, and a voltage VGL. Moreover, capacitors C1 to C5 serving as bypass capacitors are disposed between a supply line of the voltage GND and a supply line of VGL, between the supply line of the voltage GND and a supply line of the voltage VGH, between the supply line of the voltage GND and a supply line of the voltage VCC, and between the supply line of the voltage VGH and the supply line of the voltage VGL. Each of the capacitors C1 to C5 is a pattern of a bypass capacitor and mounted on the tape carrier 2.

Figure 13:
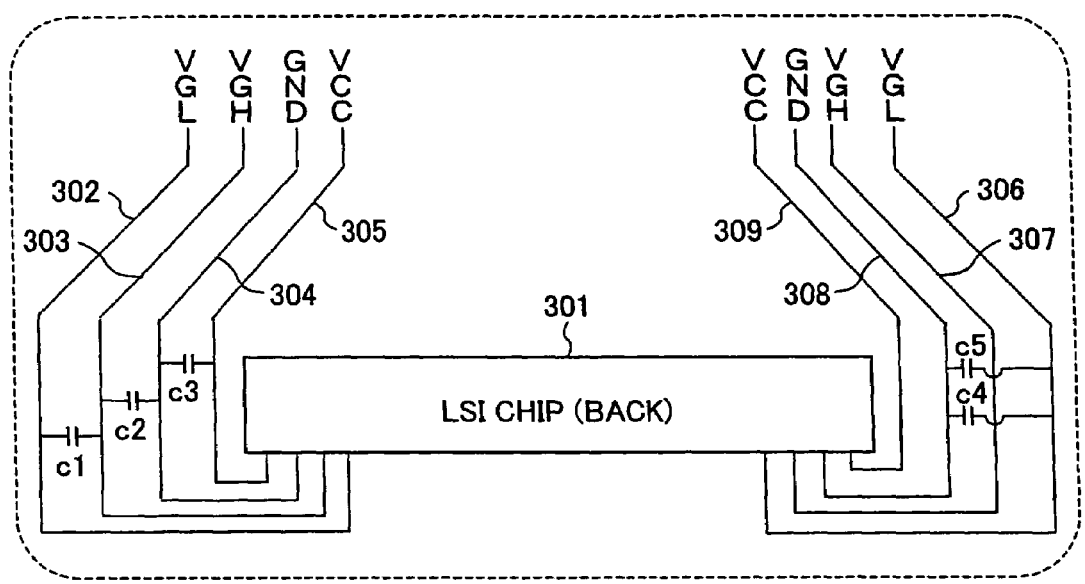
FIG. 13 is a wiring diagram, showing a prior art, which shows one example of a power supply voltage in a gate driver mounted in a liquid crystal panel.

This gate driver is different from the above-described conventional gate driver, in that its voltage supply lines for supplying power supply voltages are arranged differently. A comparison between FIG. 1 and FIG. 13 shows that, in case of the gate driver GD shown in FIG. 1, the left side (one side) of the LSI chip 3 is provided with a wire (direct wire) L1 and a wire (bypass wire) LB1. The direct wire L1, which is connected directly to the LSI chip 3, serves as a wire (first power supply voltage wire) to which the voltage VGL is applied. The wire LB1, which is not connected directly to the LSI chip 3, is connected to one of a pair of electrodes of the capacitor C2 disposed between the wire LB1 and a wire (second power supply voltage wire) to which the voltage VGH is applied. Further, the left side (one side) of the LSI chip 3 is provided with a wire (direct wire) L2 and a wire (bypass wire) LB2. The wire L2, which is connected directly to the LSI chip 3, serves as a wire (second power supply voltage wire) to which the voltage VGH is applied. The wire LB2, which is not connected directly to the LSI chip 3, is connected to one of a pair of electrodes of the capacitor C3 disposed between the wire LB2 and a wire (second power supply voltage wire) to which the voltage GND is applied. Furthermore, the left side (one side) of the LSI chip 3 is provided with a wire (direct wire) L3 and a wire (bypass wire) LB3. The wire L3, which is connected directly to the LSI chip 3, serves as a wire (second power supply voltage wire) to which the voltage GND is applied. The wire LB3, which is not connected directly to the LSI chip 3, is connected to one of a pair of electrodes of the capacitor C3 disposed between the wire LB3 and a wire (third power supply voltage wire) L4 to which the voltage VCC is applied.

The right side (other side) of the LSI chip 3 is provided with a wire L8, a wire L6, a wire (direct wire) L5, and a wire (bypass wire) LB4. The wire L8 serves as a wire to which the voltage VCC is applied. The wire L6 serves as a wire to which the voltage VGH is applied. The wire L5, which is connected directly to the LSI chip 3, serves as a wire (first power supply voltage wire) to which the voltage VGL is applied. The wire LB4, which is not connected directly to the LSI chip 3, is connected to one of a pair of electrodes of each of the capacitors C4 and C5 disposed between the wire LB4 and a wire (second power supply voltage wire) to which the voltage GND is applied.

Moreover, each of the wire L1 and the wire LB1, to which the voltage VGL is applied, is provided with a voltage input terminal so as to make it possible to apply the voltage VGL to either or both of the wire L1 and the wire LB1. Similarly, each of the wire L2 and the wire LB2, to which the voltage VGH is applied, is provided with a voltage input terminal so as to make it possible to apply the voltage VGL to either or both of the wire L2 and the wire LB2. Similarly, each of the wire L3 and the wire LB3, to which the voltage GND is applied, is provided with a voltage input terminal so as to make it possible to apply the voltage VGL to either or both of the wire L3 and the wire LB3. Similarly, each of the wire L5 and the wire LB4, to which the voltage VGL is applied, is provided with a voltage input terminal so as to make it possible to apply the voltage VGL to either or both of the wire L5 and the wire LB4.

The voltage VGL is applied to the wire LB1. The voltage VGH is applied to the wire LB2. The voltage GND is applied to the wire LB3. The voltage VGL is applied to the wire LB4. The wire LB1, the wire LB2, the wire LB3, and the wire LB4 are not connected directly to the LSI chip 3. The wire LB1, the wire LB2, the wire LB3, and the wire LB4 are bypass wires provided so as to shorten time required in a final test.

Note that, like the wire L1 and the wire L5 to which the voltage VGL is applied, the wires, provided on the right and left sides of the LSI chips, to which the same kind of voltage is applied, are connected in the LSI chip 3 by using an aluminum wire or the like.

To conduct the final test of a gate driver GD arranged as described above, the predetermined voltages are applied respectively to the wires L1 to L8, while the bypass wires LB1 to LB4 are kept open. In this way, the gate driver GD is judged to be good or defective. Only those gate drivers GD that are judged to be good are mounted on the liquid crystal panel 31. For actual operation of a gate driver GD mounted on the liquid crystal panel 31, the predetermined voltages are applied not only to the voltage supply wires provided originally, but also to the bypass wires.

Specifically, the wire LB1, to which the voltage VGL is applied after the gate driver GD is mounted in the liquid crystal panel 31, is open during a final test. Therefore, although the capacitor C1 is disposed between the wire LB1 and the wire L2, which supplies the voltage VGH, a predetermined voltage is applied to the wire L2, so that power can be supplied for testing without being affected by a capacitance of the capacitor C1. The voltage VGL is applied to the wire LB1 after the gate driver GD is mounted in the liquid crystal panel 31, so that the capacitor C1 functions as a bypass capacitor disposed between the supply line of the voltage VGL and the supply line of the voltage VGH.

Similarly, the wire LB2, to which the voltage VGH is applied after the gate driver GD is mounted in the liquid crystal panel 31, is open during a final test. Therefore, although the capacitor C2 is disposed between the wire LB2 and the wire L3, which supplies the voltage GND, a predetermined voltage is applied to the wire L3, so that power can be supplied for testing without being affected by a capacitance of the capacitor C2. The voltage VGH is applied to the wire LB2 after the gate driver GD is mounted on the liquid crystal panel 31, so that the capacitor C2 functions as a bypass capacitor disposed between the supply line of the voltage VGH and the supply line of the voltage GND.

Similarly, the wire LB3, to which the voltage GND is applied after the gate driver GD is mounted in the liquid crystal panel 31, is open during a final test. Therefore, although the capacitor C3 is disposed between the wire LB3 and the wire L4, which supplies the voltage VCC, a predetermined voltage is applied to the wire L4, so that power can be supplied for testing without being affected by a capacitance of the capacitor C3. The voltage GND is applied to the wire LB3 after the gate driver GD is mounted in the liquid crystal panel 31, so that the capacitor C3 functions as a bypass capacitor disposed between the supply line of the voltage GND and the supply line of the voltage VCC.

Similarly, the wire LB4, to which the voltage VGL is applied after the gate driver GD is mounted in the liquid crystal panel 31, is open during a final test. Therefore, although the capacitors C4 and C5 are disposed between the wire LB4 and the wire L7, which supplies the voltage GND, a predetermined voltage is applied to the wire L7, so that power can be supplied for testing without being affected by capacitances of the capacitors C4 and C5. The voltage VGL is applied to the wire LB4 after the gate driver GD is mounted in the liquid crystal panel 31, so that the capacitors C4 and C5 function as bypass capacitors disposed between the supply line of the voltage VGL and the supply line of the voltage GND.

Thus, with the gate driver GD, it is possible to quickly supply power to the voltage VGL, the voltage VGH, the voltage GNG, and the voltage VCC without being affected by such factors as the capacitance of the capacitors C1 to C5. This is achieved by applying corresponding predetermined voltages respectively to the wires L1 to L5, connected directly to the LSI chip 3, while keeping the wires (bypass wires) LB1 to LB4 open during a final test. This shortens time required in the final test.

Note that the above-described arrangement is applicable not only to the gate driver GD, but also to the source driver SD. In the case of the source driver SD, a wire for applying a voltage VCC, a wire for applying a voltage GND, and a wire for applying a reference voltage (for a liquid crystal driving voltage) VR are arranged in the above-described manner. By doing so, it is possible to supply power at the time of a final test with little influence of the capacitors.

Figure 4:
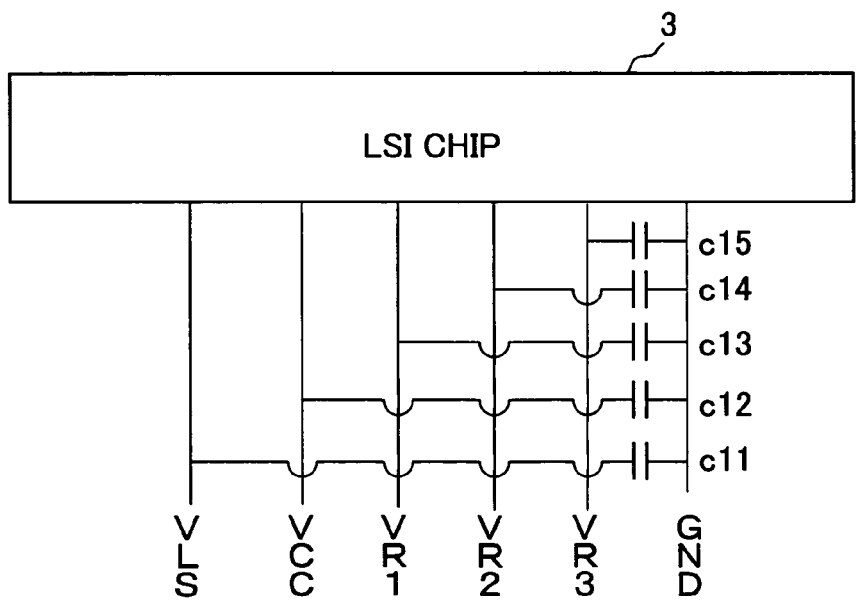
FIG. 4 is a wiring diagram showing one example of a power supply voltage wire in a conventional source driver as compared with FIG. 3.

Although detailed description is omitted, a conventional source driver has been arranged so that, as shown in FIG. 4, capacitors c11 to c15 are disposed respectively between a voltage GND wire and a voltage VGL wire, between the voltage GND wire and the a voltage VCC wire, between the voltage GND wire and a voltage VR1 wire, and between the voltage GND wire and a voltage VR2 wire.

Figure 3:
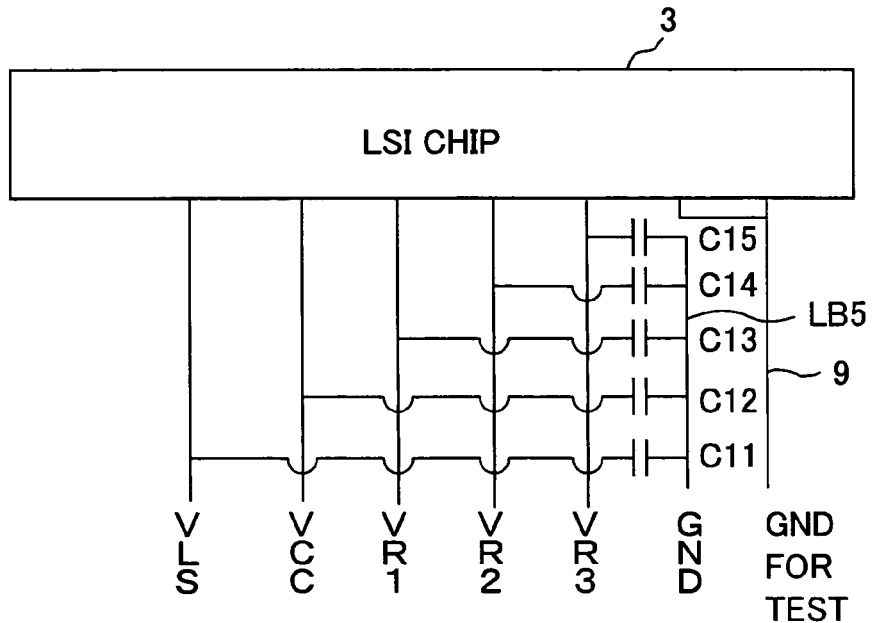
FIG. 3 is a wiring diagram showing one example of a power supply voltage wire in a source driver mounted in the liquid crystal panel.

In such a case, the source driver SD only needs to be arranged, as shown in FIG. 3, so as to have (i) a wire (direct wire) L9, serving as a voltage GND wire, which is connected directly to the LSI chip 3, and (ii) a wire (bypass wire) LB5, not connected directly to the LSI chip 3, which is connected to one of a pair of electrodes of each of the capacitors C11 to C15 disposed respectively between the wire LB5 and a voltage VLS wire, between the wire LB5 and a voltage VCC wire, between the wire LB5 and a voltage VR1 wire, between the wire LB5 and a voltage VR2 wire, and between the wire LB5 and a voltage VR3 wire.

Further, in a wire example of FIG. 1, the power supply voltage wires are allocated to the right and left sides of the LSI chip 3. Accordingly, the capacitors C1 to C5 are divided into two groups. One group includes the capacitors C1 to C3 connected to the left side; the other group includes the capacitors C4 and C5 connected to the right side. This enables more compact packaging than when only one side of the LSI chip 3 is provided with wires and capacitors.

Note that although the conventional gate driver has been arranged so that a chip capacitor serving as a bypass capacitor is externally mounted on a tape carrier, the gate driver GD of the present embodiment is arranged so that the capacitors (bypass capacitors) C1 to C5 are formed directly on the tape carrier 2, so that the capacitors C1 to C5 can be mounted closer to the LSI chip 3. As a result, an arrangement more resistant to power supply noise is possible.

Further, although the present embodiment is arranged so that the LSI chip 3 serving as a semiconductor chip is mounted on the tape carrier 2, it is needless to say that the present invention can be applied to a type of semiconductor device arranged so that a plurality of semiconductor chips are mounted on a tape carrier.

As described above, in order to solve the foregoing problems, a semiconductor device according to the present invention includes a first power supply voltage wire for supplying a first power supply voltage to a semiconductor chip; a second power supply voltage wire for supplying a second power supply voltage to the semiconductor chip; and a capacitor provided between the first power supply voltage wire and the second power supply voltage wire, the first power supply voltage wire and the second power supply voltage wire being provided on a tape carrier on which the semiconductor chip is mounted, the first power supply voltage wire including: (i) a bypass wire connected not directly to the semiconductor chip but to one of a pair of electrodes of the capacitor; and (ii) a direct wire connected directly to the semiconductor chip, each of the bypass wire and the direct wire including a voltage input terminal.

In addition to the foregoing arrangement, the semiconductor device according to the present invention can be arranged so that, during an electrical screening test, the bypass wire of the first power supply voltage wire is open, and the first power supply voltage is applied to the direct wire of the first power supply voltage wire, and the second power supply voltage is applied to the second power supply voltage wire.

In order to solve the foregoing problems, a method of the present invention for electrically inspecting the semiconductor device of the present invention includes the step of supplying the first power supply voltage to the semiconductor chip from the direct wire of the first power supply voltage wire and supplying the second power supply voltage to the semiconductor chip from the second power supply voltage wire, the step being carried out under such a condition that the bypass wire of the first power supply voltage wire is open.

According to the present invention, the first power supply voltage wire in the semiconductor device includes (i) a bypass wire, connected to one of a pair of electrodes of the capacitor, which is not connected to the semiconductor chip, and (ii) a direct wire connected directly to the semiconductor chip. Moreover, each of the bypass wire and the direct wire includes a voltage input terminal, so that the first power supply voltage can be applied to either or both of the bypass wire and the direct wire.

Therefore, when the first power supply voltage and the second power supply voltage are supplied to the semiconductor chip so as to conduct an electrical screening test, the first power supply voltage is supplied to the semiconductor chip from the direct wire of the first power supply voltage wire, and the second power supply voltage is supplied to the semiconductor chip from the second power supply voltage wire, under such a condition that the bypass wire of the first power supply voltage wire is open. This makes it possible to quickly supply the first power supply voltage and the second power supply voltage to the semiconductor chip (speedily supply power) so as to conduct a test without being affected by such factors as the capacitance of the capacitors.

As a result, in a semiconductor device with built-in capacitors, it becomes possible to shorten time required in an electrical screening test (final test) so as to reduce cost.

In addition to the foregoing arrangement, the semiconductor device according to the present invention can be arranged so that the first power supply voltage is applied to the bypass wire and the direct wire of the first power supply voltage wire during normal operation.

In order to solve the foregoing problems, an electronic apparatus according to the present invention includes the semiconductor device according to the present invention and is arranged so that the first power supply voltage is applied to the bypass wire and the direct wire of the first power supply voltage wire.

When an electronic apparatus including the semiconductor device is operated normally, the first power supply voltage is applied to the bypass wire and the direct wire in the first power supply voltage wire, so that the capacitor connected to the bypass wire functions as a bypass capacitor provided between the first power supply voltage wire and the second power supply voltage wire without any problem, thereby preventing malfunction of the semiconductor chip.

Further, in order to solve the foregoing problems, another semiconductor device according to the present invention includes a first power supply voltage wire for supplying a first power supply voltage to a semiconductor chip; a second power supply voltage wire for supplying a second power supply voltage to the semiconductor chip; a third power supply voltage wire for supplying a third power supply voltage; a capacitor provided between the first power supply voltage wire and the second power supply voltage wire; and another capacitor provided between the second power supply voltage wire and the third power supply voltage wire, the first power supply voltage wire, the second power supply voltage wire, and the third power supply voltage wire being provided on a tape carrier on which a semiconductor chip is mounted, the first power supply voltage wire including: (i) a bypass wire connected not directly to the semiconductor chip but to one of a pair of electrodes of the capacitor disposed between the bypass wire and the second power supply voltage wire; and (ii) a direct wire connected directly to the semiconductor chip, each of the bypass wire and the direct wire including a voltage input terminal, and the second power supply voltage wire including: (iii) a bypass wire connected not directly to the semiconductor chip but to one of a pair of electrodes of the another capacitor disposed between the bypass wire and the third power supply voltage wire; and (iv) a direct wire connected directly to the semiconductor chip and to one of a pair of electrodes of the capacitor disposed between the direct wire and the first power supply voltage wire, each of the bypass wire and the direct wire including a voltage input terminal.

In addition to the foregoing arrangement, the another semiconductor device according to the present invention can be arranged so that, during an electrical screening test, the bypass wire of the first power supply voltage wire and the bypass wire of the second power supply voltage wire are open, and the first power supply voltage is applied to the direct wire of the first power supply voltage wire, and the second power supply voltage is applied to the direct wire of the second power supply voltage wire, and the third power supply voltage is applied to the third power supply voltage wire.

In order to solve the foregoing problems, another method of the present invention for electrically inspecting the another semiconductor device of the present invention includes the step of supplying the first power supply voltage to the semiconductor chip from the direct wire of the first power supply voltage wire, supplying the second power supply voltage to the semiconductor chip from the second power supply voltage wire, and supplying the third power supply voltage to the semiconductor chip from the third power supply voltage wire, the step being carried out under such a condition that the bypass wire of the first power supply voltage wire and the bypass wire of the second power supply voltage wire are open.

According to the present invention, the first power supply voltage wire includes (i) a bypass wire, connected to one of a pair of electrodes of the capacitor disposed between the bypass wire and the second power supply voltage wire, which is not connected to the semiconductor chip, and (ii) a direct wire connected directly to the semiconductor chip. Moreover, each of the bypass wire and the direct wire includes a voltage input terminal, so that the first power supply voltage can be applied to either or both of the bypass wire and the direct wire.

Further, the second power supply voltage wire includes (i) a bypass wire, connected to one of a pair of electrodes of the capacitor disposed between the bypass wire and the third power supply voltage wire, which is not connected to the semiconductor chip, and (ii) a direct wire connected directly to the semiconductor chip and to one of a pair of electrodes of the capacitor disposed between the direct wire and the first power supply voltage wire. Moreover, each of the bypass wire and the direct wire is provided with a voltage input terminal, so that the second power supply voltage can be applied to either or both of the bypass wire and the direct wire.

Therefore, when the first, second, and third power supply voltages are supplied to the semiconductor chip so as to conduct an electrical screening test, the first power supply voltage is supplied to the semiconductor chip from the direct wire of the first power supply voltage wire, and the second power supply voltage is supplied to the semiconductor chip from the direct wire of the second power supply voltage wire, and the third power supply voltage is supplied to the semiconductor chip from the third power supply voltage wire, under such a condition that the bypass wire of the first power supply voltage wire and the bypass wire of the second power supply voltage wire are open. This makes it possible to quickly supply the first, second, and third power supply voltages to the semiconductor chip (speedily supply power) so as to conduct a test without being affected by a capacitance and the like of the capacitors respectively disposed between the first power supply voltage wire and the second power supply voltage wire and between the second power supply voltage wire and the third power supply voltage wire.

As a result, in a semiconductor device with built-in capacitors, it becomes possible to shorten time required in an electrical screening test so as to reduce cost.

In addition to the foregoing arrangement, the another semiconductor device according to the present invention can be arranged so that, during normal operation, the first power supply voltage is applied to the bypass wire and the direct wire of the first power supply voltage wire, and the second power supply voltage is applied to the bypass wire and the direct wire of the second power supply voltage wire.

In order to solve the foregoing problems, another electronic apparatus according to the present invention includes the another semiconductor device according to the present invention and is arranged so that the first power supply voltage is applied to the bypass wires and the direct wires in the first power supply voltage wire, and the second power supply voltage is applied to the bypass wires and the direct wires of the second power supply voltage wire.

When an electronic apparatus including the semiconductor device is operated normally, the first power supply voltage is applied to the bypass wire and the direct wire of the first power supply voltage wire, and the second power supply voltage is applied to the bypass wire and the direct wire of the second power supply voltage wire, so that the capacitor connected to the bypass wire of the first power supply voltage wire functions as a bypass capacitor provided between the first power supply voltage wire and the second power supply voltage wire without any problem, and the capacitor connected to the bypass wire of the second power supply voltage wire functions as a bypass capacitor provided between the second power supply voltage wire and the third power supply voltage wire without any problem, thereby preventing malfunction of the semiconductor chip.

As described above, a semiconductor device according to the present invention includes a first power supply voltage wire for supplying a first power supply voltage to a semiconductor chip; a second power supply voltage wire for supplying a second power supply voltage to the semiconductor chip; and a capacitor provided between the first power supply voltage wire and the second power supply voltage wire, the first power supply voltage wire and the second power supply voltage wire being provided on a tape carrier on which the semiconductor chip is mounted, the first power supply voltage wire including: (i) a bypass wire connected not directly to the semiconductor chip but to one of a pair of electrodes of the capacitor; and (ii) a direct wire connected directly to the semiconductor chip, each of the bypass wire and the direct wire including a voltage input terminal.

As described above, a method of the present invention for electrically inspecting the semiconductor device of the present invention includes the step of supplying the first power supply voltage to the semiconductor chip from the direct wire of the first power supply voltage wire and supplying the second power supply voltage to the semiconductor chip from the second power supply voltage wire, the step being carried out under such a condition that the bypass wire of the first power supply voltage wire is open.

Further, as described above, another semiconductor device according to the present invention includes a first power supply voltage wire for supplying a first power supply voltage to the semiconductor chip; a second power supply voltage wire for supplying a second power supply voltage to the semiconductor chip; a third power supply voltage wire for supplying a third power supply voltage; a capacitor provided between the first power supply voltage wire and the second power supply voltage wire; and another capacitor provided between the second power supply voltage wire and the third power supply voltage wire, the first power supply voltage wire, the second power supply voltage wire, and the third power supply voltage wire being provided on a tape carrier on which a semiconductor chip is mounted, the first power supply voltage wire including: (i) a bypass wire connected not directly to the semiconductor chip but to one of a pair of electrodes of the capacitor disposed between the bypass wire and the second power supply voltage wire; and (ii) a direct wire connected directly to the semiconductor chip, each of the bypass wire and the direct wire including a voltage input terminal, and the second power supply voltage wire including: (iii) a bypass wire connected not directly to the semiconductor chip but to one of a pair of electrodes of the another capacitor disposed between the bypass wire and the third power supply voltage wire; and (iv) a direct wire connected directly to the semiconductor chip and to one of a pair of electrodes of the capacitor disposed between the direct wire and the first power supply voltage wire, each of the bypass wire and the direct wire including a voltage input terminal.

As described above, another method of the present invention for electrically inspecting the another semiconductor device of the present invention includes the step of supplying the first power supply voltage to the semiconductor chip from the direct wire of the first power supply voltage wire, supplying the second power supply voltage to the semiconductor chip from the second power supply voltage wire, and supplying the third power supply voltage to the semiconductor chip from the third power supply voltage wire, the step being carried out under such a condition that the bypass wire of the first power supply voltage wire and the bypass wire of the second power supply voltage wire are open.

This makes it possible to quickly supply the first power supply voltage and the second power supply voltage to the semiconductor chip and speedily supply power so as to conduct an electrical screening test of a semiconductor device without being affected by a capacitance and the like of the capacitor provided between the wires.

Therefore, a semiconductor device with built-in capacitors brings about an effect of making it possible to shorten time required in an electrical screening test so as to reduce cost.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device, comprising:
   a first power supply voltage wire for supplying a first power supply voltage to a semiconductor chip;
   a second power supply voltage wire for supplying a second power supply voltage to the semiconductor chip; and
   a capacitor provided between the first power supply voltage wire and the second power supply voltage wire,
   the first power supply voltage wire and the second power supply voltage wire being provided on a tape carrier on which the semiconductor chip is mounted,
   the first power supply voltage wire including:
       a bypass wire connected not directly to the semiconductor chip but to one of a pair of electrodes of the capacitor; and
       a direct wire connected directly to the semiconductor chip,
   each of the bypass wire and the direct wire including a voltage input terminal.

2. The semiconductor device according to claim 1, wherein, during an electrical screening test, the bypass wire of the first power supply voltage wire is open, and the first power supply voltage is applied to the direct wire of the first power supply voltage wire, and the second power supply voltage is applied to the second power supply voltage wire.

3. The semiconductor device according to claim 1, wherein the first power supply voltage is applied to the bypass wire and the direct wire of the first power supply voltage wire during normal operation.

4. A method for electrically inspecting a semiconductor device which includes:
   a first power supply voltage wire for supplying a first power supply voltage to a semiconductor chip;
   a second power supply voltage wire for supplying a second power supply voltage to the semiconductor chip; and
   a capacitor provided between the first power supply voltage wire and the second power supply voltage wire, the first power supply voltage wire and the second power supply voltage wire being provided on a tape carrier on which the semiconductor chip is mounted, the first power supply voltage wire including:
- a bypass wire connected not directly to the semiconductor chip but to one of a pair of electrodes of the capacitor; and
- a direct wire connected directly to the semiconductor chip, each of the bypass wire and the direct wire including a voltage input terminal, said method comprising the step of supplying the first power supply voltage to the semiconductor chip from the direct wire of the first power supply voltage wire and supplying the second power supply voltage to the semiconductor chip from the second power supply voltage wire, the step being carried out under such a condition that the bypass wire of the first power supply voltage wire is open.

5. An electronic apparatus comprising a semiconductor device which includes:
- a first power supply voltage wire for supplying a first power supply voltage to a semiconductor chip; and
- a second power supply voltage wire for supplying a second power supply voltage to the semiconductor chip; and
- a capacitor provided between the first power supply voltage wire and the second power supply voltage wire, the first power supply voltage wire and the second power supply voltage wire being provided on a tape carrier on which the semiconductor chip is mounted, the first power supply voltage wire including:
- a bypass wire connected not directly to the semiconductor chip but to one of a pair of electrodes of the capacitor; and
- a direct wire connected directly to the semiconductor chip, each of the bypass wire and the direct wire including a voltage input terminal, and the first power supply voltage being applied to the bypass wire and the direct wire of the first power supply voltage wire.

6. A semiconductor device, comprising:
- a first power supply voltage wire for supplying a first power supply voltage to a semiconductor chip;
- a second power supply voltage wire for supplying a second power supply voltage to the semiconductor chip;
- a third power supply voltage wire for supplying a third power supply voltage;
- a capacitor provided between the first power supply voltage wire and the second power supply voltage wire; and
- another capacitor provided between the second power supply voltage wire and the third power supply voltage wire, the first power supply voltage wire, the second power supply voltage wire, and the third power supply voltage wire being provided on a tape carrier on which a semiconductor chip is mounted, the first power supply voltage wire including:
- (i) a bypass wire connected not directly to the semiconductor chip but to one of a pair of electrodes of the capacitor disposed between the bypass wire and the second power supply voltage wire; and
- (ii) a direct wire connected directly to the semiconductor chip, each of the bypass wire and the direct wire including a voltage input terminal, and the second power supply voltage wire including:
- (iii) a bypass wire connected not directly to the semiconductor chip but to one of a pair of electrodes of said another capacitor disposed between the bypass wire and the third power supply voltage wire; and
- (iv) a direct wire connected directly to the semiconductor chip and to one of a pair of electrodes of the capacitor disposed between the direct wire and the first power supply voltage wire, each of the bypass wire and the direct wire including a voltage input terminal.

7. The semiconductor device according to claim 6, wherein, during an electrical screening test, the bypass wire of the first power supply voltage wire and the bypass wire of the second power supply voltage wire are open, and the first power supply voltage is applied to the direct wire of the first power supply voltage wire, and the second power supply voltage is applied to the direct wire of the second power supply voltage wire, and the third power supply voltage is applied to the third power supply voltage wire.

8. The semiconductor device according to claim 6, wherein, during normal operation, the first power supply voltage is applied to the bypass wire and the direct wire of the first power supply voltage wire, and the second power supply voltage is applied to the bypass wire and the direct wire of the second power supply voltage wire.

9. A method for electrically inspecting a semiconductor device which includes:
- a first power supply voltage wire for supplying a first power supply voltage to a semiconductor chip;
- a second power supply voltage wire for supplying a second power supply voltage to the semiconductor chip;
- a third power supply voltage wire for supplying a third power supply voltage;
- a capacitor provided between the first power supply voltage wire and the second power supply voltage wire; and
- another capacitor provided between the second power supply voltage wire and the third power supply voltage wire, the first power supply voltage wire, the second power supply voltage wire, and the third power supply voltage wire being provided on a tape carrier on which a semiconductor chip is mounted, the first power supply voltage wire including:
- (i) a bypass wire connected not directly to the semiconductor chip but to one of a pair of electrodes of the capacitor disposed between the bypass wire and the second power supply voltage wire; and
- (ii) a direct wire connected directly to the semiconductor chip, each of the bypass wire and the direct wire including a voltage input terminal, and the second power supply voltage wire including:
- (iii) a bypass wire connected not directly to the semiconductor chip but to one of a pair of electrodes of said another capacitor disposed between the bypass wire and the third power supply voltage wire; and
- (iv) a direct wire connected directly to the semiconductor chip and to one of a pair of electrodes of the capacitor disposed between the direct wire and the first power supply voltage wire, each of the bypass wire and the direct wire including a voltage input terminal, said method comprising the step of supplying the first power supply voltage to the semiconductor chip from the direct wire of the first power supply voltage wire, supplying the second power supply voltage to the semiconductor chip from the second power supply voltage wire, and supplying the third power supply voltage to the semiconductor chip from the third power supply voltage wire, the step being carried out under such a condition that the bypass wire of the first power supply voltage wire and the bypass wire of the second power supply voltage wire are open.

10. An electronic apparatus comprising a semiconductor device which includes:

a first power supply voltage wire for supplying a first power supply voltage to a semiconductor chip;

a second power supply voltage wire for supplying a second power supply voltage to the semiconductor chip;

a third power supply voltage wire for supplying a third power supply voltage;

a capacitor provided between the first power supply voltage wire and the second power supply voltage wire; and another capacitor provided between the second power supply voltage wire and the third power supply voltage wire, the first power supply voltage wire, the second power supply voltage wire, and the third power supply voltage wire being provided on a tape carrier on which a semiconductor chip is mounted, the first power supply voltage wire including:

(i) a bypass wire connected not directly to the semiconductor chip but to one of a pair of electrodes of the capacitor disposed between the bypass wire and the second power supply voltage wire; and (ii) a direct wire connected directly to the semiconductor chip, each of the bypass wire and the direct wire including a voltage input terminal, and the second power supply voltage wire including:

(iii) a bypass wire connected not directly to the semiconductor chip but to one of a pair of electrodes of said another capacitor disposed between the bypass wire and the third power supply voltage wire; and (iv) a direct wire connected directly to the semiconductor chip and to one of a pair of electrodes of the capacitor disposed between the direct wire and the first power supply voltage wire, each of the bypass wire and the direct wire including a voltage input terminal, and the first power supply voltage being applied to the bypass wire and the direct wire of the first power supply voltage wire, and the second power supply voltage being applied to the bypass wire and the direct wire of the second power supply voltage wire.

11. A semiconductor device, comprising:

a first power supply voltage wire for supplying a first power supply voltage to a semiconductor chip;

a second power supply voltage wire for supplying a second power supply voltage to the semiconductor chip; and a third power supply voltage wire connected through a capacitor to the second power supply voltage wire, the third power supply voltage wire being electrically open during a semiconductor chip test, and the first power supply voltage being applied to the third power supply voltage wire during normal operation.

12. A method for electrically inspecting a semiconductor device which includes: a first power supply voltage wire for supplying a first power supply voltage to a semiconductor chip; a second power supply voltage wire for supplying a second power supply voltage to the semiconductor chip; and a third power supply voltage wire connected through a capacitor to the second power supply voltage wire, said method comprising the step of supplying the first power supply voltage through the first power supply voltage wire to the semiconductor chip and supplying the second power supply voltage through the second power supply voltage wire to the semiconductor chip, the step being carried out under such a condition that the third power supply voltage wire is electrically open.

13. An electronic apparatus comprising the semiconductor device which includes:

a first power supply voltage wire for supplying a first power supply voltage to a semiconductor chip;

a second power supply voltage wire for supplying a second power supply voltage to the semiconductor chip; and a third power supply voltage wire connected through a capacitor to the second power supply voltage wire, the third power supply voltage wire being electrically open during a semiconductor chip test, and the first power supply voltage being applied to the third power supply voltage wire during normal operation.

* * * * *